United States Patent
Liu

(10) Patent No.: US 10,423,076 B2
(45) Date of Patent: Sep. 24, 2019

(54) METHODS FOR DETERMINING RESIST DEFORMATION

(71) Applicant: ASML Netherlands B.V., Veldhoven (NL)

(72) Inventor: Peng Liu, Cupertino, CA (US)

(73) Assignee: ASML Netherlands B.V., Veldhoven (NL)

( * ) Notice: Subject to any disclaimer, the term of this patent is extended or adjusted under 35 U.S.C. 154(b) by 95 days.

(21) Appl. No.: 15/553,879

(22) PCT Filed: Feb. 24, 2016

(86) PCT No.: PCT/EP2016/053877
§ 371 (c)(1),
(2) Date: Aug. 25, 2017

(87) PCT Pub. No.: WO2016/146355
PCT Pub. Date: Sep. 22, 2016

(65) Prior Publication Data
US 2018/0246419 A1 Aug. 30, 2018

Related U.S. Application Data

(60) Provisional application No. 62/133,782, filed on Mar. 16, 2015.

(51) Int. Cl.
G03F 7/20 (2006.01)

(52) U.S. Cl.
CPC .......... *G03F 7/70608* (2013.01); *G03F 7/705* (2013.01); *G03F 7/70291* (2013.01); *G03F 7/70441* (2013.01); *G03F 7/70558* (2013.01); *G03F 7/70616* (2013.01)

(58) Field of Classification Search
CPC ............. G03F 7/70608; G03F 7/70291; G03F 7/70441; G03F 7/705; G03F 7/70558; G03F 7/70616
USPC ......................................................... 430/30
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 7,587,704 B2 | 9/2009 | Ye et al. | |
| 8,200,468 B2 | 6/2012 | Ye et al. | |
| 9,459,537 B2 | 10/2016 | Cao et al. | |
| 2002/0131055 A1 | 9/2002 | Niu et al. | |
| 2008/0239267 A1 | 10/2008 | Suzuki et al. | |
| 2008/0304034 A1 | 12/2008 | Ockwell et al. | |
| 2012/0327383 A1 | 12/2012 | Cao et al. | |
| 2013/0204594 A1 | 8/2013 | Liu | |

FOREIGN PATENT DOCUMENTS

| | | |
|---|---|---|
| EP | 0816926 | 1/1998 |
| JP | 2008250139 | 10/2008 |
| JP | 2013162125 | 8/2013 |
| WO | 2015/007511 | 1/2015 |

OTHER PUBLICATIONS

International Search Report and Written Opinion dated Jun. 30, 2016 in corresponding International Patent Application No. PCT/EP2016/053877.
English translation of Taiwan Office Action dated Jun. 29, 2017 in corresponding Taiwan Patent Application No. 105107234 (5 pages).
Yeh, Wei-Ming et al., "Comparison of positive tone versus negative tone resist pattern collapse behavior", Journal of Vacuum Science & Technology B, vol. 28, No. 6, pp. C6S6-C6S11 (2010).
Bourrier, David et al., "Potential of BPN as a new negative photoresist for a very thick layer with high aspect ratio", Microsystem Technologies, vol. 20, pp. 2089-2096 (Jan. 2014).
Kim, Sang-Kon, "Thermal Effect Study for a Chemically Amplified Resist", Journal of the Korean Physical Society, Sep. 2006, vol. 49, No. 3, pp. 1211-1216.
Fang, Chao et al,: "A Physics-based Model for Negative Tone Development Materials", Journal of Photopolymer Science and Technology, Jul. 8, 2014, vol. 27, No. 1, pp. 53-59.
Kotera, M., et al.: "Three-dimensional simulation of resist pattern deformation by surface tension at the drying process", Microelectronic Engineering, Jan. 28, 2005, vol. 78-79, pp. 515-520.
Tollkuhn, B., et al,: "Simplified resist models for efficient simulation of contact holes and line ends", Microelectronic Engineering, Jan. 13, 2005, vol. 78-79, pp. 509-514.

*Primary Examiner* — Christopher G Young
(74) *Attorney, Agent, or Firm* — Pillsbury Winthrop Shaw Pittman LLP

(57) ABSTRACT

A method including: obtaining at least a characteristic of deformation of a resist layer in a first direction, as if there were no deformation in any directions perpendicular to the first direction; obtaining at least a characteristic of deformation of the resist layer in a second direction as if there were no deformation in the first direction, the second direction being perpendicular different to from the first direction; and obtaining at least a characteristic of three-dimensional deformation of the resist layer based on the characteristic of the deformation in the first direction and the characteristic of the deformation in the second direction.

20 Claims, 21 Drawing Sheets

METHODS FOR DETERMINING RESIST DEFORMATION

CROSS-REFERENCE TO RELATED APPLICATIONS

This application claims priority of U.S. application 62/133,782 which was filed on Mar. 16, 2015 and which is incorporated herein in its entirety by reference.

TECHNICAL FIELD

The description herein relates to lithographic apparatuses and processes, and more particularly to methods for determining deformation of a resist layer where the deformation is caused by a lithographic apparatus or process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

The lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, metrology (e.g., SEM), etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

Disclosed herein is a computer-implemented method comprising: obtaining at least a characteristic of deformation of a resist layer in a first direction, as if there were no deformation in any directions perpendicular to the first direction; obtaining at least a characteristic of deformation of the resist layer in a second direction as if there were no deformation in the first direction, the second direction being perpendicular different to from the first direction; obtaining at least a characteristic of three-dimensional deformation of the resist layer based on the characteristic of the deformation in the first direction and the characteristic of the deformation in the second direction.

According to an embodiment, the second direction is perpendicular to the first direction.

According to an embodiment, the method further comprises obtaining at least a characteristic of deformation in a third direction as if there were no deformation in the first direction.

According to an embodiment, obtaining at least a characteristic of three-dimensional deformation is additionally based on the characteristic of deformation in the third direction.

According to an embodiment, the first, second and third directions are mutually perpendicular.

According to an embodiment, the characteristic of three-dimensional deformation is a change in an edge displacement error.

According to an embodiment, the characteristic of deformation in the first direction is a displacement of a location in the resist layer in the first direction.

According to an embodiment, the characteristic of deformation in the second direction is a displacement of a location in the resist layer in the second direction.

According to an embodiment, the resist layer is on a substrate.

According to an embodiment, the first direction is perpendicular to the substrate.

According to an embodiment, the second direction is parallel to the substrate.

According to an embodiment, the substrate constraints at least one of the characteristics of deformations in the first direction and in the second direction.

According to an embodiment, a portion of the resist layer in direct contact with the substrate has zero displacement in the first direction.

According to an embodiment, a portion of the resist layer in direct contact with the substrate has zero displacement in the second direction.

According to an embodiment, obtaining at least a characteristic of deformation of the resist layer in the first direction comprises integrating engineering strain over a distance in the first direction.

According to an embodiment, obtaining at least a characteristic of deformation of the resist layer in the second direction comprises balancing sheer stress and normal stress in the second direction.

According to an embodiment, the resist layer is developed with a positive tone developer.

According to an embodiment, the resist layer is developed with a negative tone developer.

According to an embodiment, portions of the resist layer that are dissolved in development have a Young's modulus of zero.

According to an embodiment, the method further comprises adjusting a parameter of a device manufacturing process or a device manufacturing apparatus based on the characteristic of three-dimensional deformation.

According to an embodiment, the resist layer will undergo one or more physical or chemical treatments during the device manufacturing process or using the device manufacturing apparatus.

According to an embodiment, the device manufacturing process is selected from a group consisting of lithography, etching, deposition, doping, metrology, and a combination thereof.

According to an embodiment, the device manufacturing apparatus is selected from a group consisting of a stepper, an etcher, a spinner, an oven, an optical metrology tool, an electron microscope, an ion implanter, a deposition chamber, and a combination thereof.

According to an embodiment, the parameter is a parameter of a design layout.

According to an embodiment, the method further comprises manufacturing a mask after adjusting the parameter.

According to an embodiment, the method further comprises determining an overlapping process window (OPW) of a plurality of patterns of a design layout, based on the characteristic of three-dimensional deformation.

According to an embodiment, the method further comprises determining or predicting, existence, probability of existence, one or more characteristics, or a combination thereof, of a defect produced from the plurality of patterns, based on the OPW.

Disclosed herein is a computer-implemented method for improving a lithographic process for imaging a portion of a design layout onto a substrate using a lithographic projection apparatus, the method comprising: computing a multi-variable cost function, the multi-variable cost function being a function of at least a characteristic of deformation of a resist layer on the substrate and a plurality of design variables that are characteristics of the lithographic process; reconfiguring one or more of the characteristics of the lithographic process by adjusting one or more of the design variables until a certain termination condition is satisfied.

According to an embodiment, the characteristic of deformation is a function of at least some of the design variables.

According to an embodiment, the cost function is a function of an edge placement error.

According to an embodiment, the one or more of the characteristics comprise at least one parameter of the design layout.

According to an embodiment, the method further comprises manufacturing a mask after reconfiguring the parameter of the design layout.

According to an embodiment, the characteristic of deformation of the resist layer is a strain at a location in the resist layer.

According to an embodiment, the characteristic of deformation of the resist layer is displacement of a location in the resist layer.

According to an embodiment, computing the multi-variable cost function comprises: obtaining at least a first characteristic of deformation of a resist layer in a first direction, as if there were no deformation in any directions perpendicular to the first direction; obtaining at least a second characteristic of deformation of the resist layer in a second direction as if there were no deformation in the first direction, the second direction being different from the first direction; obtaining the characteristic of deformation based on the first characteristic and the second characteristic.

According to an embodiment, computing the multi-variable cost function further comprises determining an overlapping process window (OPW) of a plurality of patterns of the design layout, based on the characteristic of three-dimensional deformation.

According to an embodiment, the method further comprises determining or predicting, existence, probability of existence, one or more characteristics, or a combination thereof, of a defect produced from the plurality of patterns, based on the OPW.

Also disclosed herein is a non-transitory computer-readable medium having values of a stochastic variation or a variable that is a function of the stochastic variation or that affects the stochastic variation, at a plurality of conditions and at a plurality of values of design variables.

DETAILED DESCRIPTION

Figure 1:
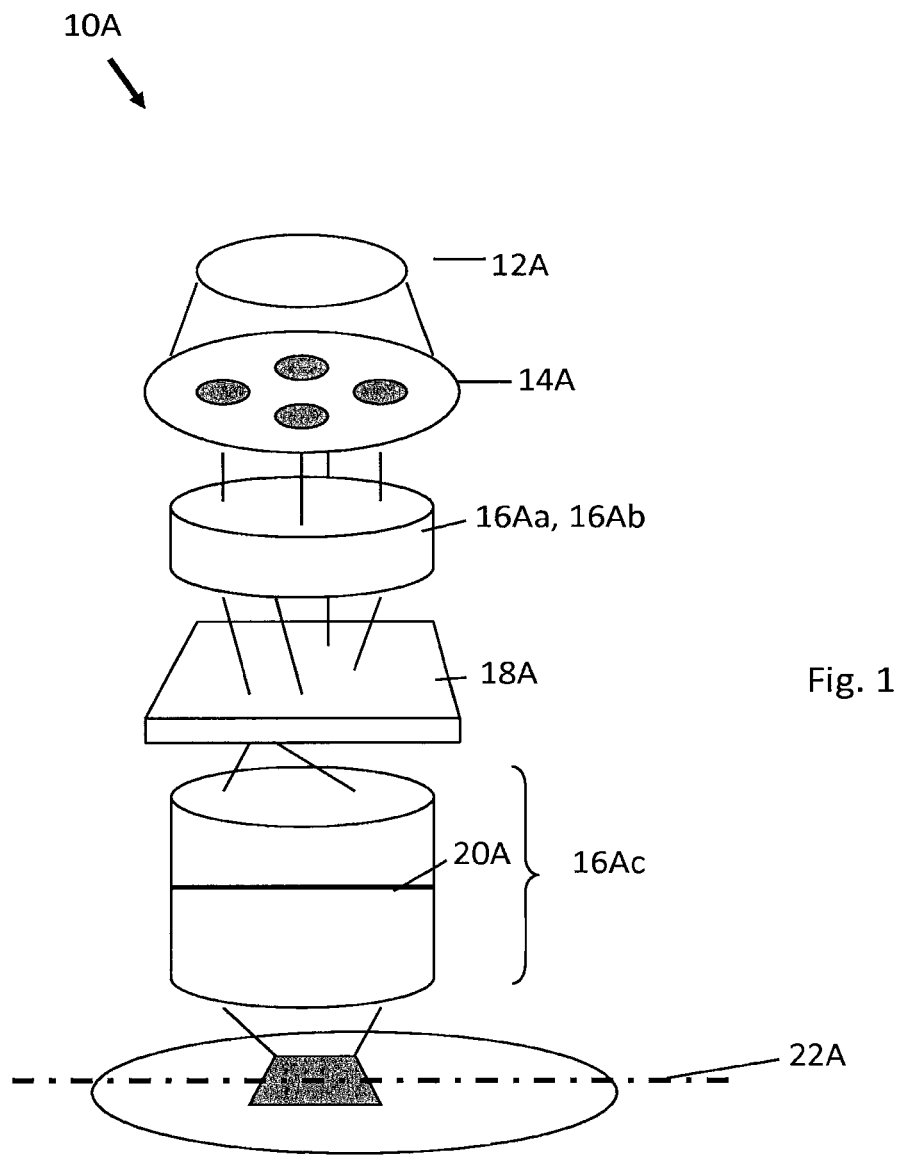
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, that a physical patterning device is not necessarily used but a design layout can be used to represent a physical patterning device.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The terms "optimizing" and "optimization" as used herein mean adjusting a lithographic projection apparatus such that results and/or processes of lithography have more desirable characteristics, such as higher accuracy of projection of design layouts on a substrate, larger process windows, etc. The terms "optimizing" and "optimization" do not necessarily require that results and/or processes of lithography have the most desirable characteristics, such as highest accuracy of projection of design layouts on a substrate, largest process windows, etc.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
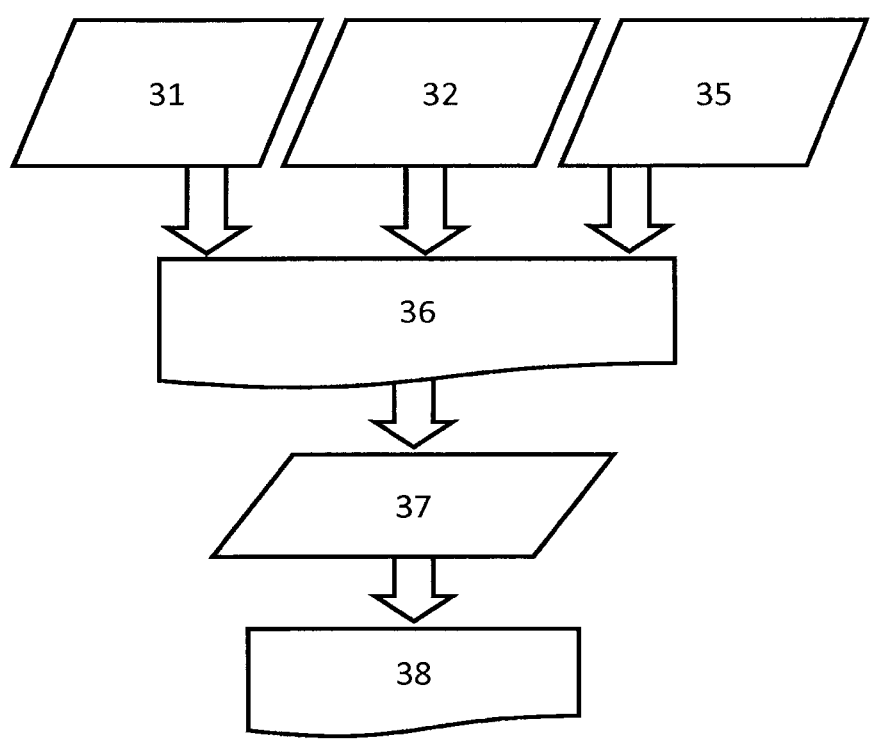
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

The resist layer is a layer of radiation-sensitive material and may have various chemical compositions. The resist layer usually has a small but finite thickness that may be comparable in size to patterns imaged onto the resist. The resist layer may undergo various treatments in a lithographic process. For example, the resist may be exposed to radiation such as EUV or DUV, which induces chemical reactions in the resist. The resist may undergo a post-exposure bake (PEB), development (e.g., positive tone development or negative tone development), and/or a hard bake. Each of these treatments may cause the resist to deform in all three dimensions and the deformation may be three-dimensional location dependent. The deformation of the resist may affect downstream treatments such as material deposition and etching. In a lithographic process using negative tone development, the impact of the resist deformation on resist top loss and critical dimension may be especially significant. Therefore, a resist model 37 with the ability to predict deformation of the resist is beneficial to more accurate lithography and higher yield. The resist model 37 may also be able to predict the reaction of the resist layer to various other physical and chemical treatments in the lithographic process.

Deformation of the resist layer may be determined using a variety of methods such as a finite element analysis. These methods are either computationally expensive, or do not yield accurate enough prediction of the deformation. A method that determines resist deformation and balances accuracy and speed allows easier integration of resist deformation prediction into existing algorithms for a lithographic process.

The deformation of the resist may be represented by the strain field in the resist. Different physical/mathematical equivalent choices may be made for the expression of a strain field. Depending on the amount of strain, or local deformation, the analysis of deformation may be divided into three deformation theories: Finite strain theory, Infinitesimal strain theory, and Large-displacement or large-rotation theory.

Finite strain theory, also called large strain theory, large deformation theory, deals with deformations in which both rotations and strains are arbitrarily large. In this case, the undeformed and deformed configurations of a continuum are significantly different and a clear distinction has to be made between them. Finite strain theory is suitable for the analysis of deformation in elastomers, plastically-deforming materials and other fluids and biological soft tissue.

Infinitesimal strain theory, also called small strain theory, small deformation theory, small displacement theory, or small displacement-gradient theory, deals with deformations in which strains and rotations are both small. In this case, the undeformed and deformed configurations of a body can be assumed identical. The infinitesimal strain theory is suitable for the analysis of deformations of materials exhibiting elastic behavior, such as materials found in mechanical and civil engineering applications, e.g. concrete and steel.

Large-displacement or large-rotation theory, which assumes small strains but large rotations and displacements.

The description herein is not limited to a particular representation of the strain or a particular strain theory. For simplicity, the engineering strain is used below as an example in this description. The engineering strain (also known as the Cauchy strain) is expressed as the ratio of total deformation to the initial dimensions of a body.

Figure 3:
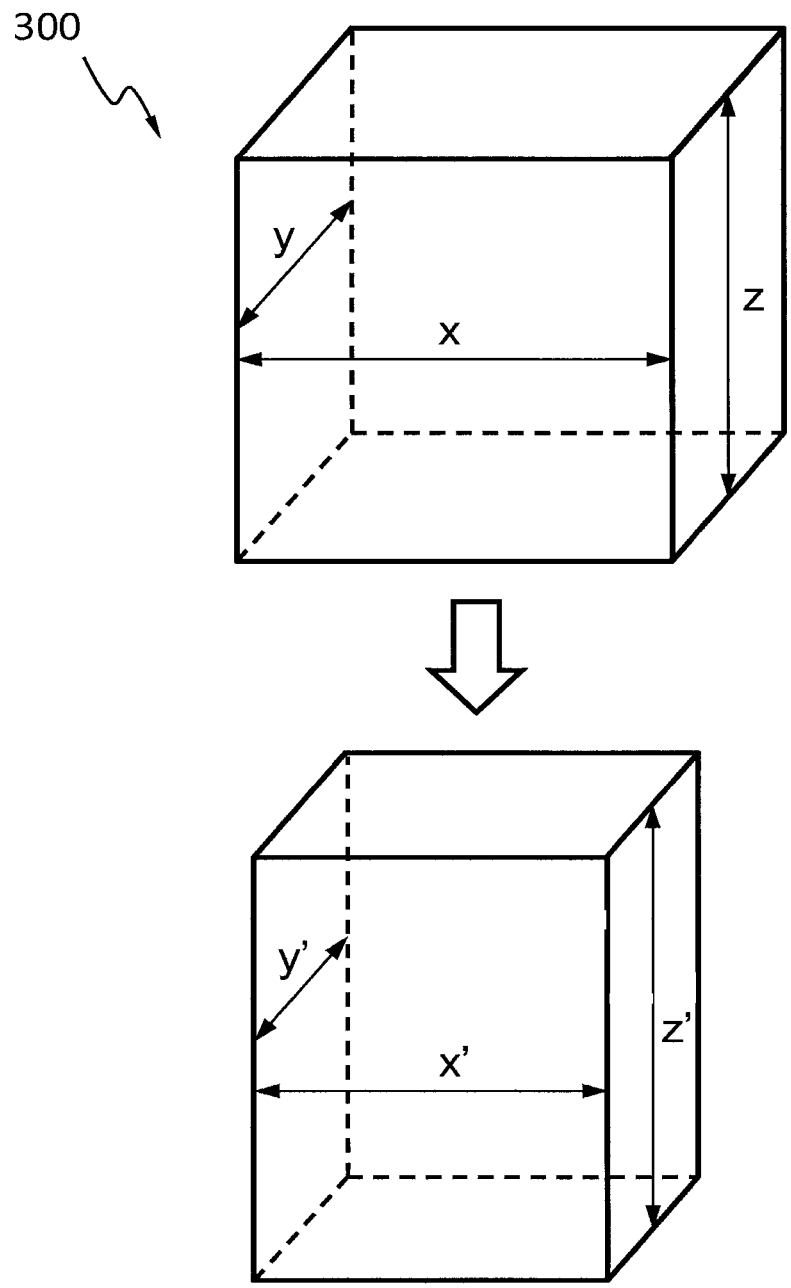
FIG. 3 illustrates the concept of the engineering strain.

FIG. 3 illustrates the concept of the engineering strain. A body 300 has initial dimensions represented by its widths x, y, z in three mutually orthogonal directions. The body 300 deforms such that its widths in the three directions change to x', y', z', respectively. The engineering strain is a vector $((x'-x)/x, (y'-y)/y, (z'-z)/z)$.

Figure 4:
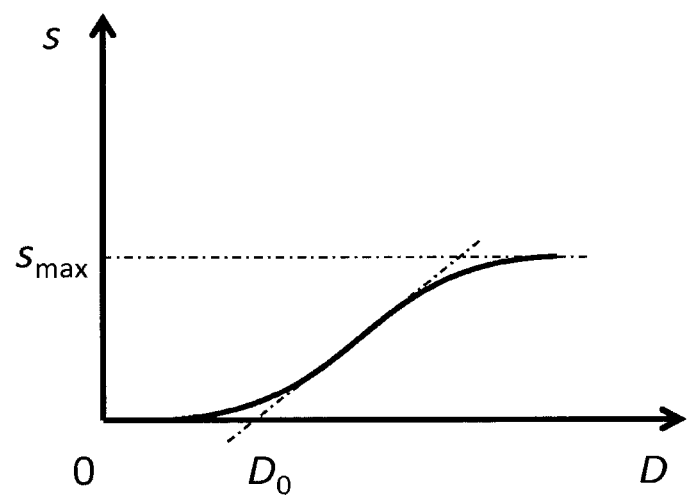
FIG. 4 shows an exemplary relationship between local deformation s (e.g., the engineering strain in this example) and a characteristic D of the lithographic process.
Figures 5A, 5B, 5C, 5D:
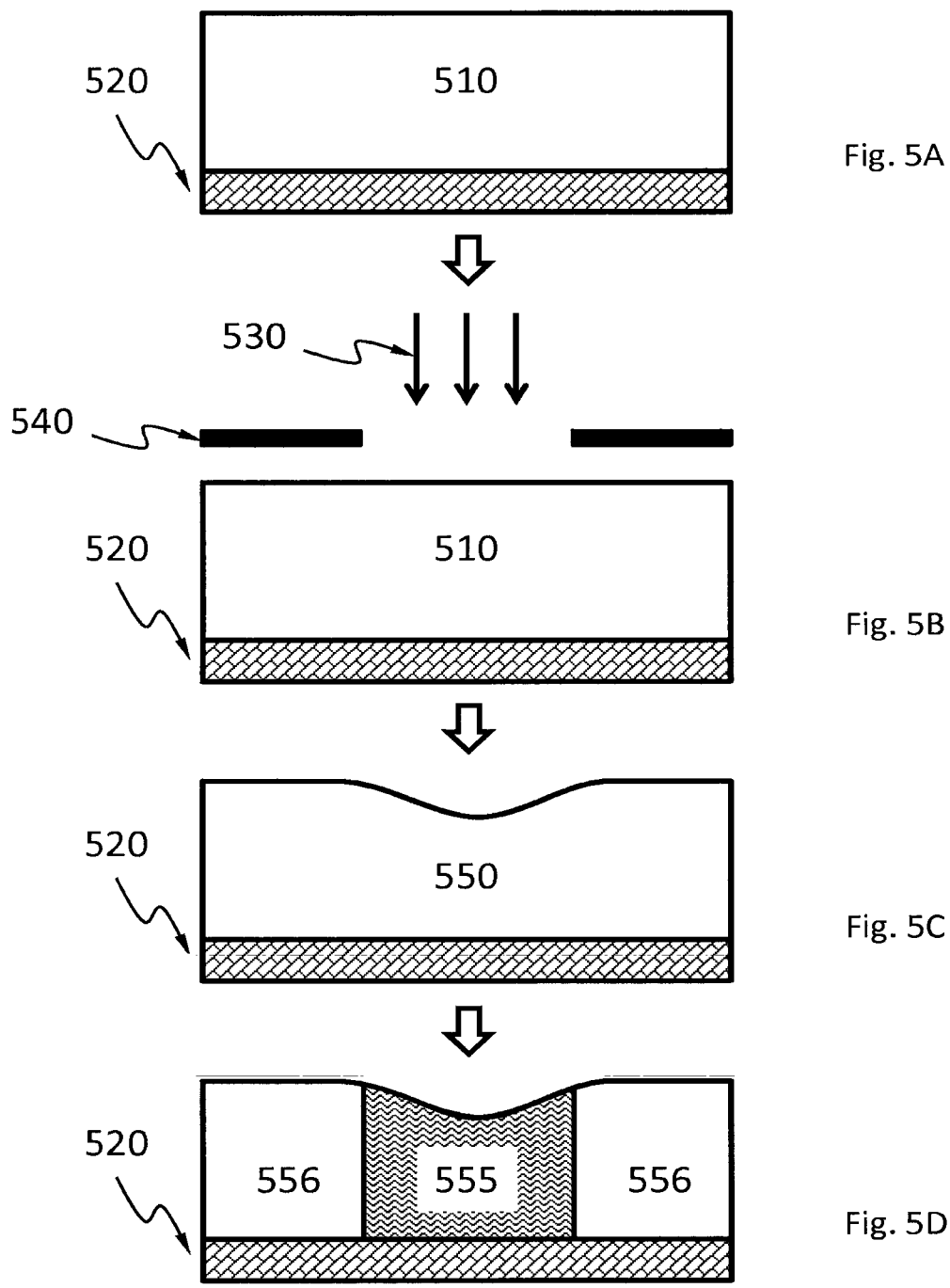
FIG. 5A, FIG. 5B, FIG. 5C and FIG. 5D schematically show exemplary deformation of a resist layer on a substrate.

FIG. 4 shows an exemplary relationship between local deformation s (e.g., the engineering strain in this example) and a characteristic D of the lithographic process. The characteristic D may be local dose, local radiation intensity, local temperature and duration of PEB, local development time, local concentration of a chemical species (e.g., acid, deprotection species), etc. The local deformation s may have a non-linear relationship with the characteristic D. In the example in FIG. 3, the local deformation s significantly increases when the characteristic D reaches a threshold $D_0$; the local deformation s saturates at a maximum value $s_{max}$. The relationship between the local deformation s and the characteristic D of the lithographic process may be determined from experimental data, empirically, by simulation, or obtained from a database.

FIG. 5A, FIG. 5B, FIG. 5C and FIG. 5D schematically show exemplary deformation of a resist layer 510 on a substrate 520. The resist layer 510 is exposed to radiation 530 through a patterning device 540. The resist layer 510 may undergo post-exposure treatments such as PEB and deform into a deformed resist layer 550. In this example, the deformation of the resist layer 510 is such that the portion of the deformed resist layer 550 exposed to the radiation has a smaller thickness than the rest of the deformed resist layer 550. A portion 555 of the deformed resist layer 550 received sufficiently high dose during the exposure to remain on the substrate 520 after negative tone development and the rest (e.g., portions 556) of the deformed resist layer 550 is dissolved after negative tone development. Alternatively, the portion 555 of the deformed resist layer 550 received sufficiently high dose during the exposure to dissolve during positive tone development and the rest of the deformed resist layer 550 remains on the substrate 520 after positive tone development. Whether the portion 555 remains or dissolves depends on the chemical composition of the resist and the chemical composition of the developer.

Figure 6:
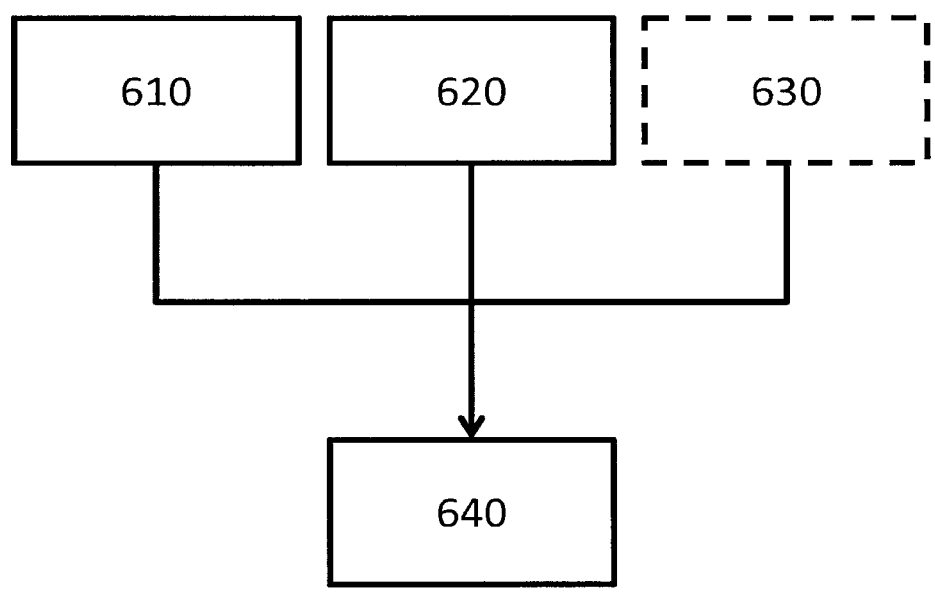
FIG. 6 shows a flow chart for a method of obtaining (e.g., determines or estimates) at least a characteristic of three-dimensional deformation in a resist layer on a substrate, according to an embodiment.

Rigorous calculation of deformation in a resist layer can be very time consuming. FIG. 6 shows a flow chart for a method of obtaining (e.g., determines or estimates) at least a characteristic of three-dimensional deformation in a resist layer on a substrate, according to an embodiment. This method independently obtains (e.g., determines or estimates) at least a characteristic of deformation of the resist layer in a first direction (e.g., the vertical direction, namely the direction perpendicular to the substrate), at least a characteristic of deformation in a second direction (e.g., a lateral direction, namely a direction parallel to the substrate)

perpendicular to the first direction, and optionally at least a characteristic of deformation in a third direction perpendicular to both the first and second directions. The method then obtains (e.g., determines or estimates) at least a characteristic of the three-dimensional deformation based on the characteristic of the deformation in the first direction and the characteristic of the deformation in the second direction, and optionally the characteristic of the deformation in the third direction. Namely, in step 610, obtaining (e.g., determining or estimating) at least a characteristic of deformation in the first direction as if there were no deformation in any directions perpendicular to the first direction; in step 620, obtaining (e.g., determining or estimating) at least a characteristic of deformation in the second direction as if there were no deformation in the first direction; in optional step 630, obtaining (e.g., determining or estimating) at least a characteristic of deformation in the third direction as if there were no deformation in the first direction. In step 640, obtaining at least a characteristic of three-dimensional deformation of the resist layer based on the characteristic of the deformation in the first direction, the characteristic of the deformation in the second direction, and optionally the characteristic of the deformation in the third direction. In step 620, according to an embodiment, at least a characteristic of deformation in directions (all lateral directions, namely all directions parallel to the substrate) perpendicular to the first direction may be obtained.

The characteristic of the three-dimensional deformation, of the deformation in the vertical direction, or of the deformation in the lateral directions may include translation, rotation, tilt, contraction, expansion, etc. at one or more locations of the resist layer or even the entire strain field of the resist layer. The characteristic may have constraints (e.g., physical, geometrical or mechanical constraints). For example, the portion of the resist layer immediately in contact with the substrate may not be able to slip relative to the substrate. The constraints may be represented by boundary conditions.

Figure 7A:
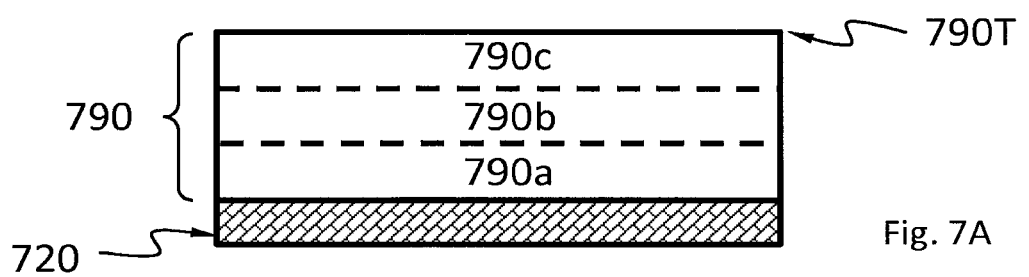
FIG. 7A and FIG. 7B schematically show a method of obtaining at least a characteristic of deformation in the vertical direction of a resist layer on a substrate, as if there were no deformation in the lateral directions.
Figure 7B:
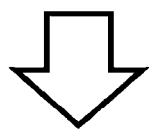
Figure 7B:
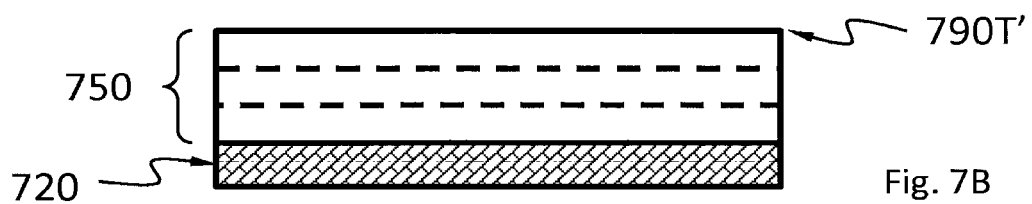

FIG. 7A and FIG. 7B schematically show a method of obtaining at least a characteristic of deformation in the vertical direction of a resist layer 790 on a substrate 720, as if there were no deformation in the lateral directions. The characteristic here is the displacement in the vertical direction (i.e., distance to the substrate 720) of a location 790T in the resist layer 790. When the resist layer 790 deforms in the vertical direction, as if there were no deformation in the lateral directions, the location 790T moves to 790T' and the displacement (790T'-790T) is the sum of thickness changes of all layers (e.g., 790a, 790b, 790c) of the resist layer 790 between the height 790T and the substrate 720. Therefore, the characteristic (the displacement of location 790T in the vertical direction in this example) may be written as (790T'−790T)=−$\int_0^{790T} SZ(x,y,z')dz'$, where $SZ(x,y,z')$ is the engineering strain in the vertical direction at location (x,y,z') in the resist layer 790. SZ greater than zero means contraction; SZ less than zero means expansion. In a generic form, the displacement w(x,y,z) of a location (x,y,z) may be written as w(x,y,z)=−$\int_0^z SZ(x,y,z')dz'$. The substrate 720 may impose a physical constraint that the displacement of the portion of the resist layer 790 immediately on the substrate 720 is zero. Namely, the boundary condition is w(x,y,0)=0. SZ may be a function of the processing parameters, which can be measured, simulated or computed. For example, SZ may be a function of local dose. The term "displacement" of a location in a resist layer means the change of position of a material volume (e.g., an infinitesimal material volume) in the resist layer. The change of position may be a result of deformation of the resist layer.

Figure 8A:
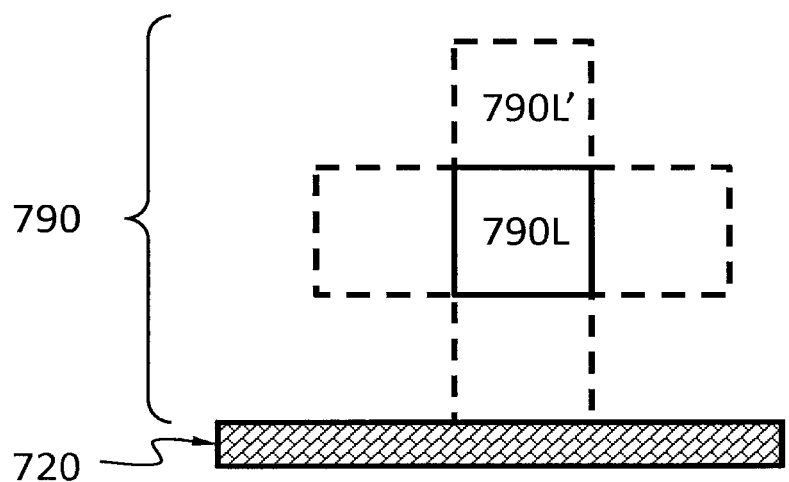
FIG. 8A and FIG. 8B schematically show a method of obtaining at least a characteristic of deformation in the lateral directions of a resist layer on a substrate, as if there were no deformation in the vertical directions.
Figure 8B:
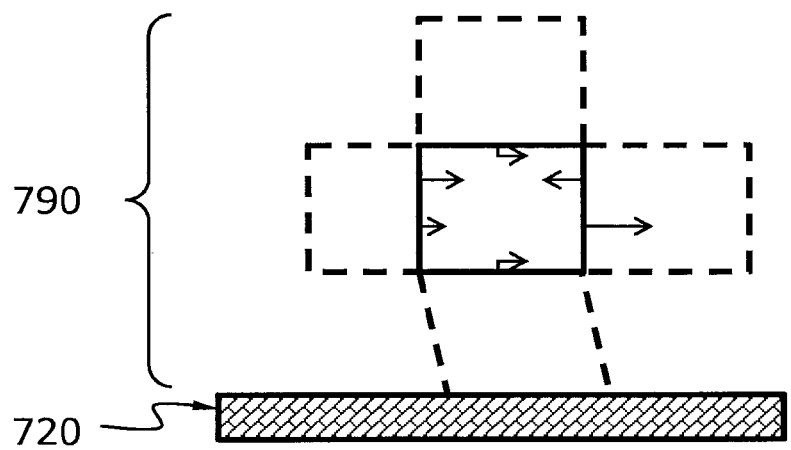

FIG. 8A and FIG. 8B schematically show a method of obtaining at least a characteristic of deformation in the lateral directions of a resist layer 790 on a substrate 720, as if there were no deformation in the vertical directions. The characteristic here is the displacement in the lateral directions of a location 790L in the resist layer 790. When the resist layer 790 deforms in the lateral directions, as if there were no deformation in the vertical direction, the location 790L moves to 790L' and the displacement (790L'-790L) is caused be a balance of sheer stress and normal stress in the lateral directions. Therefore, the characteristic (the displacement of location 790L in the lateral directions in this example) may be obtained by solving the following equations (if deformation in the lateral directions are uncoupled)

$$\frac{\partial}{\partial x}\left[E\left(\frac{\partial u}{\partial x}+SX\right)\right]-2G\frac{u}{z^2}=0 \text{ and}$$

$$\frac{\partial}{\partial y}\left[E\left(\frac{\partial v}{\partial y}+SY\right)\right]-2G\frac{v}{z^2}=0.$$

(u, v) is the displacement in the lateral directions. z is the coordinate in the vertical direction of location 790L. G is the shear modulus of the resist. E is the Young's modulus of the resist. E and G may be functions of the processing parameters, which can be measured, simulated or computed. For example, E and G may be functions of local dose. SX and SY are the engineering strains in the lateral directions. These equations are not the only form of approximation. Other suitable forms of approximation are possible. The substrate 720 may impose a physical constraint that the displacement of the portion of the resist layer 790 immediately on the substrate 720 is zero. Namely, the boundary condition is u(x,y,0)=v(X, y, 0)=0. Each of E, G, u, v, SX, SY may be a function of location. The term $$2G\frac{u}{z^2}$$

is not necessarily the only form for the shear stress. The shear stress may have other forms of dependency on z. The exact form may be affected by the composition, dimension, treatment, etc. of the resist layer and may be affected by the substrate. In an embodiment, the shear stress term decreases as z increases. Larger z means being farther away from the substrate.

If deformation in the lateral directions are coupled, the characteristic (the displacement of location 790L in the lateral directions in this example) may be obtained by solving the following equations $$\frac{\partial}{\partial x}\left[E\left(\frac{\partial u}{\partial x}+s\right)\right]+\frac{\partial}{\partial y}\left(G_{xy}\frac{\partial u}{\partial y}\right)-2G\frac{u}{z^2}=0 \text{ and}$$

$$\frac{\partial}{\partial y}\left[E\left(\frac{\partial v}{\partial y}+s\right)\right]+\frac{\partial}{\partial x}\left(G_{xy}\frac{\partial v}{\partial x}\right)-2G\frac{v}{z^2}=0.$$

These equations are not the only form of approximation. Other suitable forms of approximation are possible. The term $$2G\frac{u}{z^2}$$

is not necessarily the only form for the shear stress. The shear stress may have other forms of dependency on z. The exact form may be affected by the composition, dimension, treatment, etc. of the resist layer and may be affected by the substrate. In an embodiment, the shear stress term decreases as z increases. Larger z means being farther away from the substrate. Development of the resist layer may impact deformation of the resist layer. Developers may be classified into two groups: positive tone developers and negative tone developers. A portion of a resist layer that receives a dose of radiation above a certain threshold becomes soluble to a positive tone developer while a portion of the resist layer that receives a dose of radiation below the threshold remain insoluble to the positive tone developer. A portion of the resist layer that receives a dose of radiation above a certain threshold becomes insoluble to a negative tone developer while a portion of the resist layer that receives a dose of radiation below the threshold remain soluble to the negative tone developer. Negative tone developers allow using a bright-field mask to image features traditionally imaged using a dark-field mask, and lead to better image contrast.

Figure 9A:
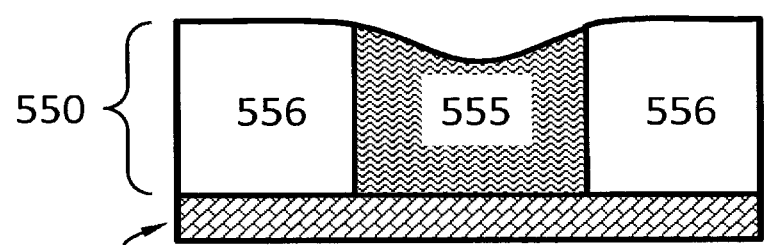
FIG. 9A, FIG. 9B, FIG. 9C and FIG. 9D schematically show exemplary additional deformation caused by development of the resist layer.
Figure 9B:
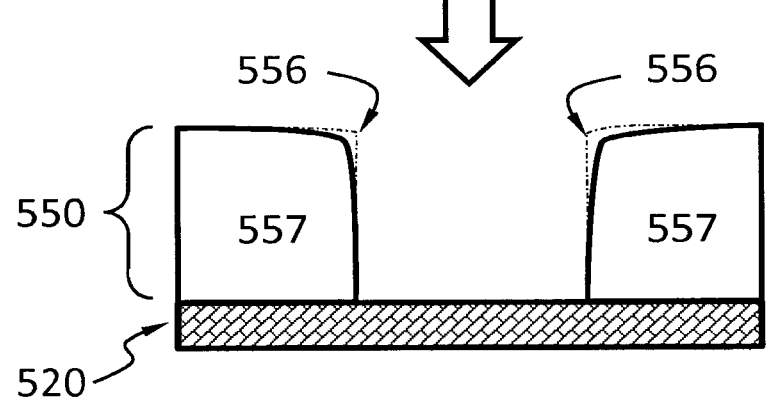
Figure 9C:
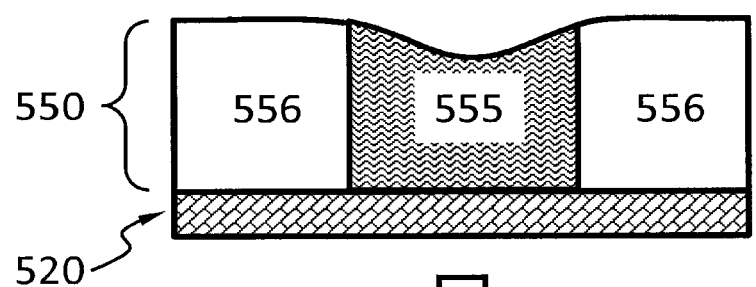
Figure 9D:
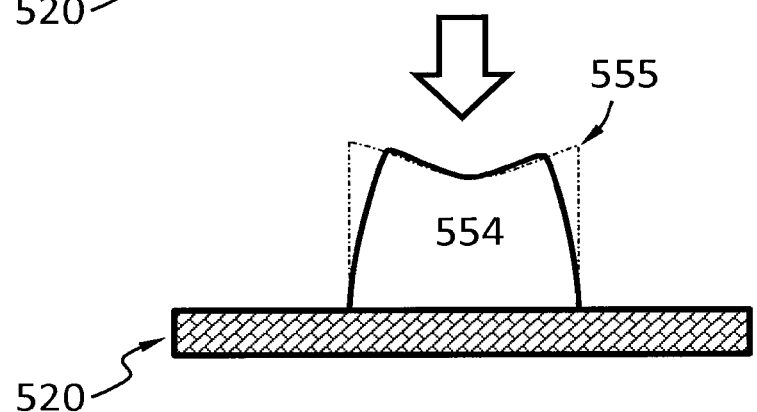

Portions of the resist layer soluble to a developer are removed during development. The removal of these portions may cause further deformation in the remaining portions of the resist layer. FIG. 9A, FIG. 9B, FIG. 9C and FIG. 9D schematically show such exemplary additional deformation. FIG. 9A shows the deformed resist layer 550 of FIG. 5, with the portion 555 that received sufficiently high dose during the exposure and thus is soluble to a positive tone developer and portions 556 that did not receive sufficiently high dose and thus is insoluble to the positive tone developer. FIG. 9B shows that, during development, the portion 555 is dissolved and the portions 556 remain. The removal of the portion 555 may cause the portions 556 to further deform into portions 557. The dotted lines represent the contour of the portions 556. In the example, the portions 556 contract and become the portions 557. FIG. 9C also shows the deformed resist layer 550 of FIG. 5, with the portion 555 that received sufficiently high dose during the exposure and thus is insoluble to a negative tone developer and portions 556 that did not receive sufficiently high dose and thus is soluble to the negative tone developer. FIG. 9D shows that, During development, the portion 555 remains and the portions 556 are dissolved. The removal of the portions 556 may cause the portion 555 to further deform into portion 554. The dotted lines represent the contour of the portion 555. In the example, the portion 555 contracts and becomes the portion 554. According to an embodiment, at least one characteristic of the additional deformation of the resist may be obtained by setting the Young's modulus E in the developed (i.e., dissolved) portions zero.

Figure 10A:
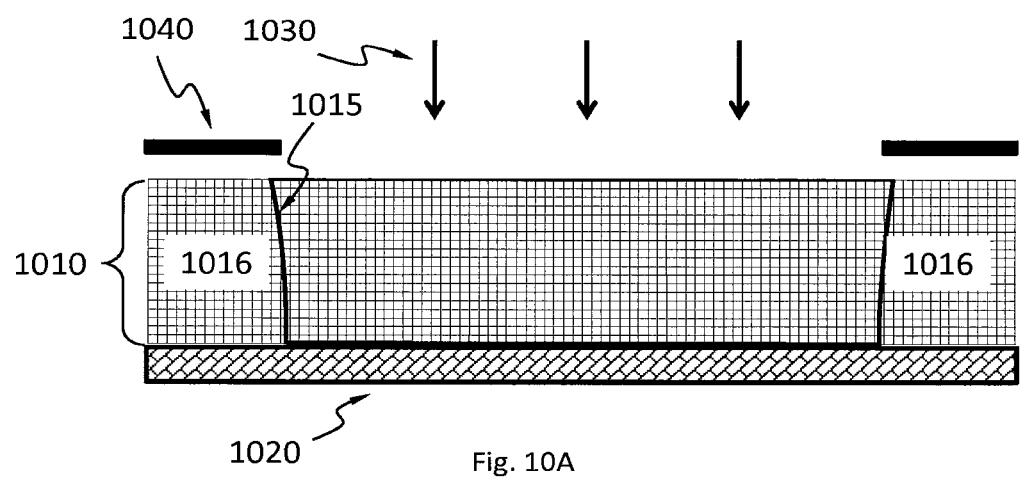
FIG. 10A and FIG. 10B show the result of the method of FIG. 6 on an exemplary resist layer.
Figure 10B:
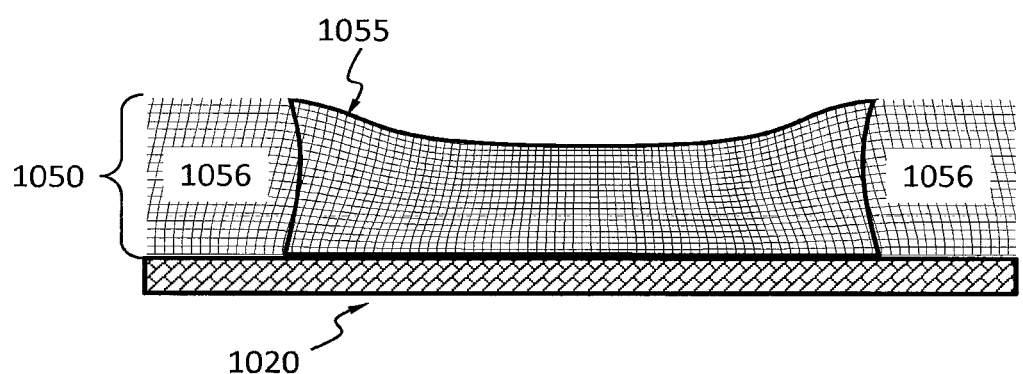

FIG. 10A and FIG. 10B show the result of the method of FIG. 6 on an exemplary resist layer 1010. In this example, the resist layer 1010 has thickness of 100 nm and deposited on a substrate 1020. The resist layer 1010 is exposed to radiation 1030 through an opening of a mask 1040. The portion 1015 enclosed by a solid line is the portion that received sufficient dose of radiation to become soluble to a positive tone developer or that received sufficient dose of radiation to become insoluble to a negative tone developer. The portions 1016 outside the solid line did not receive sufficient dose of radiation and thus remain insoluble to the positive tone developer, or remain soluble to the negative tone developer. As shown in FIG. 10B, after PEB, the resist layer 1010 deforms into the deformed resist layer 1050. The portion 1015 deforms into portion 1055; the portion 1016 deform into portions 1056.

Figure 10C:
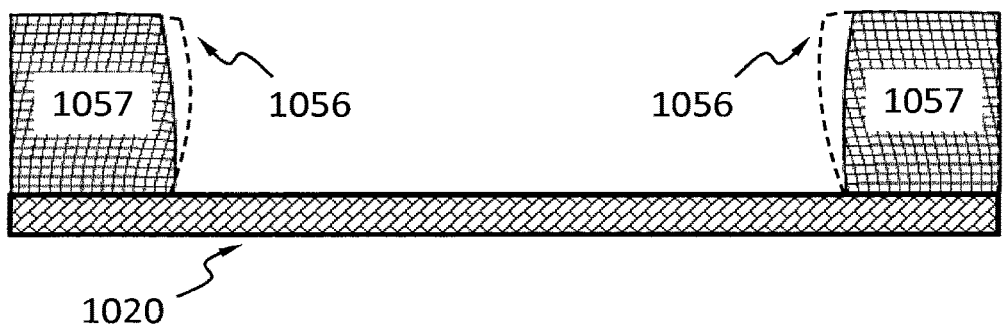
FIG. 10C and FIG. 10D show the method disclosed here can be used to determine the deformation caused by development.
Figure 10D:
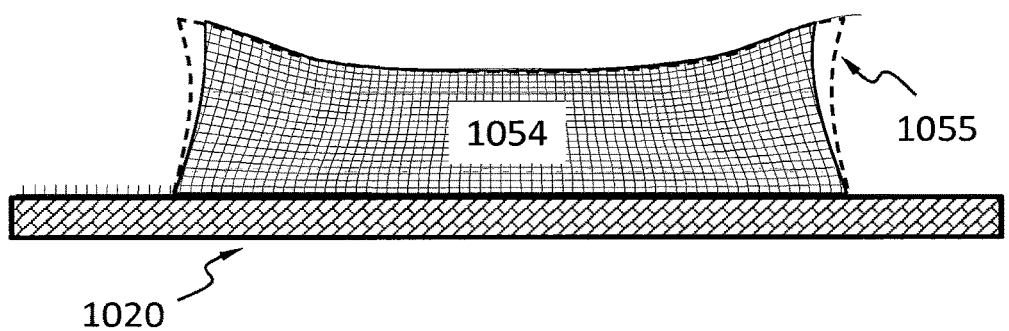

FIG. 10C and FIG. 10D show the method disclosed here can be used to determine the deformation caused by development. FIG. 10C shows that after positive tone development, the portion 1055 is removed, and the portions 1056 remain and further deform into the portions 1057. The dotted lines show the boundary of the portions 1056. FIG. 10D shows that after negative tone development, the portions 1056 are removed, and the portion 1055 remains and further deform into the portion 1054. The dotted lines show the boundary of the portion 1055.

The characteristics of the deformation in the vertical direction, the lateral directions, or of the three-dimensional deformation may be obtained using the nominal or actual processing conditions under which the resist layer is processed. The characteristics of the deformation may be location dependent.

Resist deformation may affect the process window of an individual pattern of a design layout because resist deformation may affect the resist image produced from the individual pattern. Therefore, resist deformation may affect the overlapping process window (OPW) of a group of patterns of the design layout because the OPW is the overlap of the processing windows of the individual patterns of the group. Existence, probability of existence, one or more characteristics, or a combination thereof, of a defect may be determined or predicted using the OPW affected by the resist deformation. If the values of the processing parameters fall within the OPW affected by the resist deformation, a defect does not or is unlikely to exist. Taking resist deformation into account allows more accurate determination of the OPW.

The characteristics of the deformation in the vertical direction, the lateral directions, or of the three-dimensional deformation obtained using the actual processing conditions under which the resist layer is processed may be used for determining or predicting, existence, probability of existence, one or more characteristics, or a combination thereof, of a defect produced with the device manufacturing process.

The capability of determining resist deformation may benefit many processes involved in lithography. For example, these processes may include OPC, RET, source-mask optimization, source-mask-lens optimization, mask optimization, yield optimization, process window optimization, etc. This is because deformation may affect the cost function used on such optimizations.

In an optimization for a lithographic projection apparatus or process, a cost function may be expressed as $$CF(z_1, z_2, \ldots, z_N) = \sum_{p=1}^{P} w_p f_p^2(z_1, z_2, \ldots, z_N) \qquad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. In one embodiment, the design variables ($z_1$, $z_2$, . . . , $z_N$) comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). Resist deformation may affect the edge placement error $EPE_p(z_1, z_2, \ldots, z_N)$ because resist deformation may move the location of an edge and thus may change the distance between the edge and its intended location (i.e., $EPE_p(z_1, z_2, \ldots, z_N)$). At least one characteristic of the deformation of the resist layer may be a function of the design variables.

The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, CF ($z_1, z_2, \ldots, z_N$) is not limited the form in Eq. 1. CF $z_2, \ldots, z_N$) can be in any other suitable form.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. A lower bound of desired throughput leads to an upper bound on the dose and thus has implications for the stochastic variations (e.g., imposing a lower bound on the stochastic variations). Shorter exposure time and/or lower dose generally lead to higher throughput but greater stochastic variations. Consideration of substrate throughput and minimization of the stochastic variations may constrain the possible values of the design variables because the stochastic variations are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the pupil fill ratio. For some illuminator designs, low pupil fill ratios may discard light, leading to lower throughput. Throughput may also be affected by the resist chemistry. Slower resist (e.g., a resist that requires higher amount of light to be properly exposed) leads to lower throughput.

The optimization process therefore is to find a set of values of the design variables, under the constraints ($z_1$, $z_2$, . . . , $z_N$)∈Z, that minimize the cost function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) \quad \text{(Eq. 2)}$$

Figure 11:
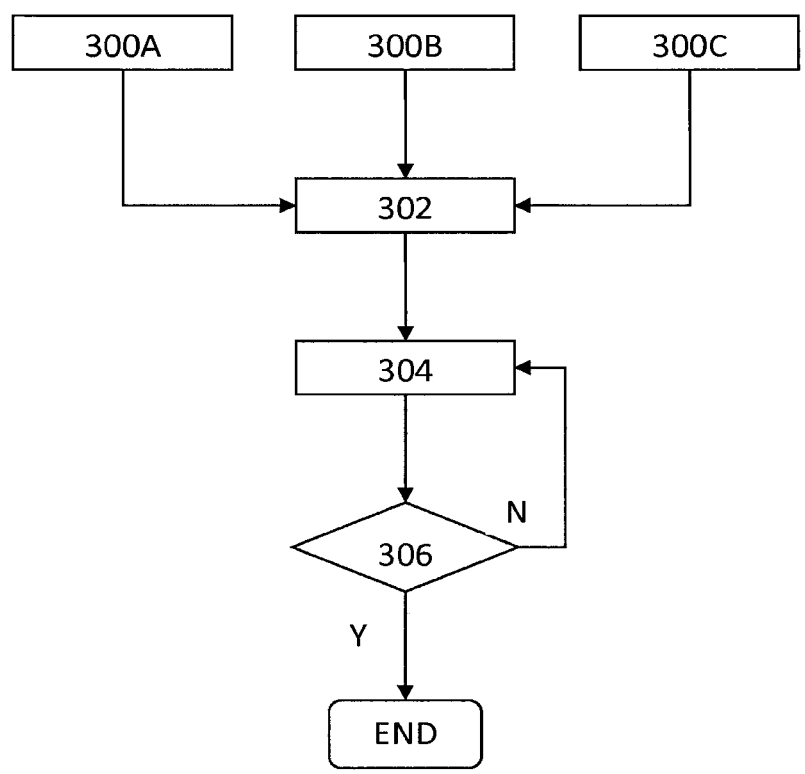
FIG. 11 is a flow diagram illustrating aspects of an example methodology of joint optimization.

A general method of optimizing the lithography projection apparatus, according to an embodiment, is illustrated in FIG. 11. This method comprises a step 302 of defining a multi-variable cost function of a plurality of design variables. The design variables may comprise any suitable combination selected from characteristics of the illumination source (300A) (e.g., pupil fill ratio, namely percentage of radiation of the source that passes through a pupil or aperture), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to an SMO. Alternatively, the design variables may include characteristics of the illumination source (300A), characteristics of the projection optics (300B) and characteristics of the design layout (300C), which leads to a source-mask-lens optimization (SMLO). In step 304, the design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step 306 is satisfied, the method ends. If none of the conditions in step 306 is satisfied, the step 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 12:
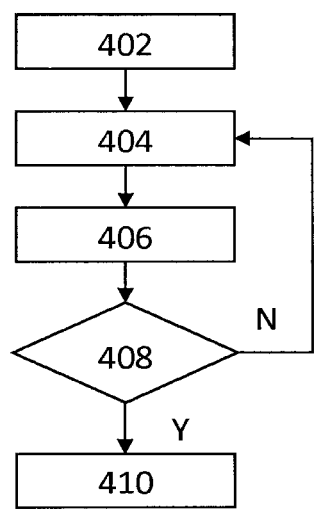
FIG. 12 shows an embodiment of another optimization method, according to an embodiment.

In FIG. 11, the optimization of all the design variables is executed simultaneously. Such flow may be called the simultaneous flow or co-optimization flow. Alternatively, the optimization of all the design variables is executed alternatively, as illustrated in FIG. 12. In this flow, in each step, some design variables are fixed while the other design variables are optimized to minimize the cost function; then in the next step, a different set of variables are fixed while the others are optimized to minimize the cost function.

These steps are executed alternatively until convergence or certain terminating conditions are met. As shown in the non-limiting example flowchart of FIG. 12, first, a design layout (step 402) is obtained, then a step of source optimization is executed in step 404, where all the design variables of the illumination source are optimized (SO) to minimize the cost function while all the other design variables are fixed. Then in the next step 406, a mask optimization (MO) is performed, where all the design variables of the patterning device are optimized to minimize the cost function while all the other design variables are fixed. These two steps are executed alternatively, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step 410, and the process stops.

Figure 13:
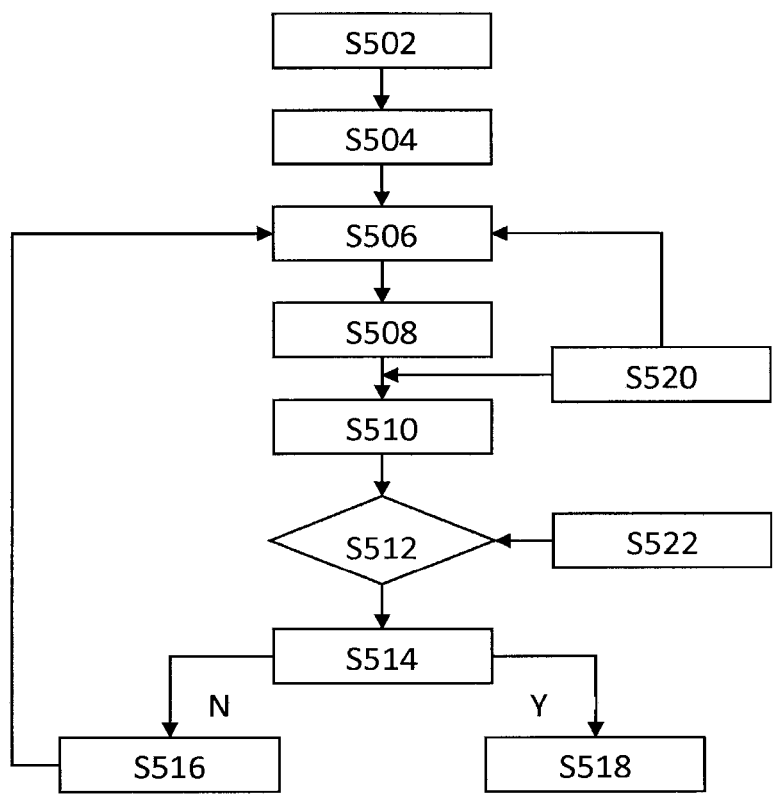
FIG. 13 and FIG. 14 show example flowcharts of various optimization processes.

FIG. 13A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 13A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_N},$$

(n=1, 2, . . . N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_N}\bigg|_{z_1=z_{1i}, z_2=z_{2i}, \ldots z_N=z_{Ni}} (z_n = z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) \quad \text{(Eq. 4)}$$

$$= \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_N}\bigg|_{z_1=z_{1i}, z_2=z_{2i}, \ldots z_N=z_{Ni}} (z_n = z_{ni}) \right)^2$$

which is a quadratic function of the design variables ($z_1$, $z_2$, ..., $z_N$). Every term is constant except the design variables ($z_1$, $z_2$, ..., $z_N$).

If the design variables ($z_1$, $z_2$, ..., $z_N$) are not under any constraints, ($z_{1(i+1)}$, $z_{2(i+1)}$, ..., $z_{N(i+1)}$) can be derived by solving by N linear equations:

$$\frac{\partial CF(z_1, z_2, \ldots, z_N)}{\partial z_n} = 0,$$

wherein n=1, 2, ..., N.

If the design variables ($z_1$, $z_2$, ..., $z_N$) are under the constraints in the form of J inequalities (e.g. tuning ranges of ($z_1$, $z_2$, ..., $z_N$))$\Sigma_{n=1}^{N} A_{nj} z_n \leq B_j$, for j=1, 2, ..., J; and K equalities (e.g. interdependence between the design variables) $\Sigma_{n=1}^{N} C_{nk} z_n \leq D_k$, for k=1, 2, ..., K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$, can be introduced to limit the difference between ($z_{1(i+1)}$, $z_{2(i+1)}$, ..., $z_{N(i+1)}$) and ($z_{1i}$, $z_{2i}$, ..., $z_{Ni}$), so that the approximation of Eq. 3 holds. Such constraints can be expressed as $z_{ni} - \Delta_D \leq z_n \leq z_{ni} + \Delta_D$. ($z_{1(i+1)}$, $z_{2(i+1)}$, ..., $z_{N(i+1)}$) can be derived using, for example, methods described in Numerical Optimization ($2^{nd}$ ed.) by Jorge Nocedal and Stephen J. Wright (Berlin N.Y.: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for p=1, ... P, $$\sum_{n=1}^{N} \frac{\partial f_p(z_1, z_2, \ldots, z_N)}{\partial z_N} \bigg|_{z_1=z_{1i}, z_2=z_{2i}, \ldots z_N=z_{Ni}} z_n \leq E_{Up} + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} z_{ni} - f_p(z_{1i}, z_{2i}, \ldots, z_{Ni}) \text{ and} \quad \text{(Eq. 6')}$$

$$-\sum_{n=1}^{N} \frac{\partial f_p(z_1, z_2, \ldots, z_N)}{\partial z_N} \bigg|_{z_1=z_{1i}, z_2=z_{2i}, \ldots z_N=z_{Ni}} z_n \leq -E_{Up} - \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} z_{ni} + f_p(z_{1i}, z_{2i}, \ldots, z_{Ni}) \quad \text{(Eq. 6'')}$$

Since Eq. 3 is generally valid only in the vicinity of ($z_1$, $z_2$, ..., $z_N$), in case the desired constraints $E_{Lp} \leq f_p(z_1, z_2, ..., z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_1$, $z_2$, ..., $z_N$), i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, ..., z_N) = (1-\lambda) \sum_{p=1}^{P} w_p f_p^2(z_1, z_2, ..., z_N) + \lambda \max_{1 \leq p \leq P} \frac{f_p(z_1, z_2, ..., z_N)}{CL_p} \quad \text{(Eq. 6''')}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition ($f_0$, $\varepsilon_0$) in the process window, wherein $f_0$ is a nominal focus and $\varepsilon_0$ is a nominal dose, minimizing one of the cost functions below in the vicinity ($f_0 \pm \Delta f, \varepsilon_0 \pm \varepsilon$):

$$CF(z_1, z_2, ..., z_N, f_0, \varepsilon_0) = \max_{(f,\varepsilon)=(f_0 \pm \Delta f, \varepsilon_0 \pm \varepsilon)} \max_p |f_p(z_1, z_2, ..., z_N, f, \varepsilon)| \quad \text{(Eq. 27)}$$

or $$CF(z_1, z_2, ..., z_N, f_0, \varepsilon_0) = \sum_{(f,\varepsilon)=(f_0 \pm \Delta f, \varepsilon_0 \pm \varepsilon)} \sum_p w_p f_p^2(z_1, z_2, ..., z_N, f, \varepsilon) \quad \text{(Eq. 27')}$$

or $$CF(z_1, z_2, ..., z_N, f_0, \varepsilon_0) = (1-\lambda) \sum_{(f,\varepsilon)=(f_0 \pm \Delta f, \varepsilon_0 \pm \varepsilon)} \sum_p w_p f_p^2 (z_1, z_2, ..., z_N, f, \varepsilon) + \lambda \max_{(f,\varepsilon)=(f_0 \pm \Delta f, \varepsilon_0 \pm \varepsilon)} \max_p |f_p (z_1, z_2, ..., z_N, f, \varepsilon)| \quad \text{(Eq. 27'')}$$

If the nominal focus $f_0$ and nominal dose $s_0$ are allowed to shift, they can be optimized jointly with the design variables ($z_1$, $z_2$, ..., $z_N$). In the next step, ($f_0 \pm \Delta f$, $\varepsilon_0 \pm \varepsilon$) is accepted as part of the process window, if a set of values of ($z_1$, $z_2$, ..., $z_N$, f, $\varepsilon$) can be found such that the cost function is within a preset limit.

Alternatively, if the focus and dose are not allowed to shift, the design variables ($z_1$, $z_2$, ..., $z_N$) are optimized with the focus and dose fixed at the nominal focus $f_0$ and nominal dose $s_0$. In an alternative embodiment, ($f_0 \pm \Delta f$, $\varepsilon_0 \pm \varepsilon$) is accepted as part of the process window, if a set of values of ($z_1$, $z_2$, ..., $z_N$) can be found such that the cost function is within a preset limit.

The methods described earlier in this disclosure can be used to minimize the respective cost functions of Eqs. 27, 27', or 27". If the design variables are characteristics of the projection optics, such as the Zernike coefficients, then minimizing the cost functions of Eqs. 27, 27', or 27" leads to process window maximization based on projection optics optimization, i.e., LO. If the design variables are characteristics of the source and patterning device in addition to those of the projection optics, then minimizing the cost function of Eqs. 27, 27', or 27" leads to process window maximizing based on SMLO, as illustrated in FIG. 11. If the design variables are characteristics of the source and patterning device and, then minimizing the cost functions of Eqs. 27, 27', or 27" leads to process window maximization based on SMO. The cost functions of Eqs. 27, 27', or 27" can also include at least one $f_p(z_1, z_2, ..., z_N)$ such as that in Eq. 7 or Eq. 8, that is a function of one or more stochastic variations such as the LWR or local CD variation of 2D features, and throughput.

Figure 14:
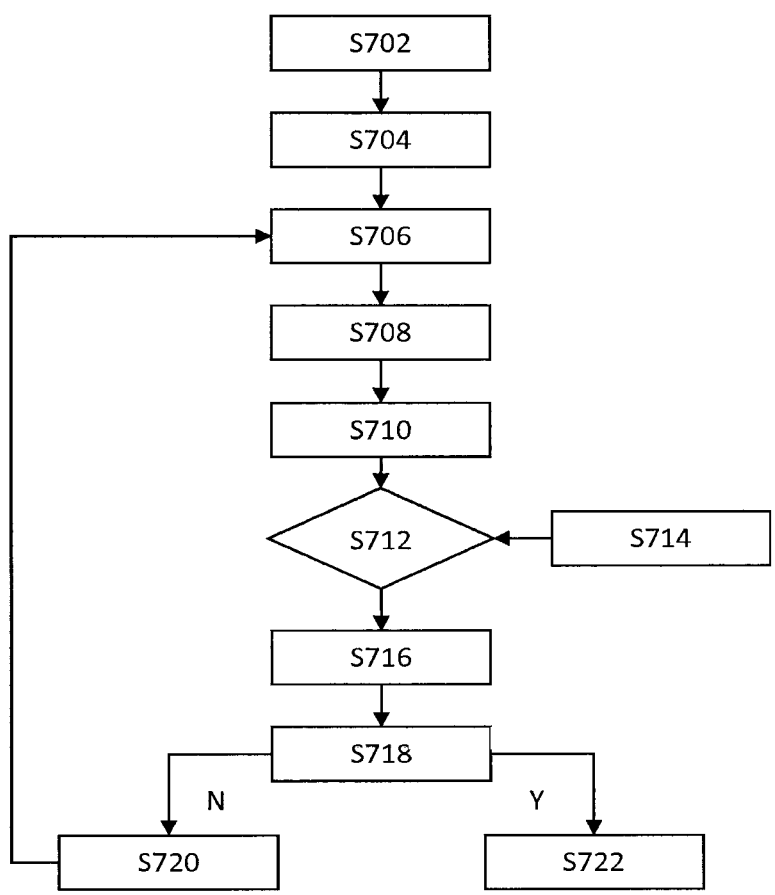

FIG. 14 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In step S708, standard multi-variable optimization techniques are applied to minimize the cost function. Note that the optimization problem can apply constraints, such as tuning ranges, during the optimization process in S708 or at a later stage in the optimization process. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 13A. As mentioned before, the final output may be a wavefront aberration map in the pupil plane, optimized to produce the desired imaging performance. The final output may also be an optimized source map and/or an optimized design layout.

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic variations or other metrics. Specifically, a computer-implemented method for increasing a throughput of a lithographic process may include optimizing a cost function that is a function of one or more stochastic variations of the lithographic process and a function of an exposure time of the substrate, in order to minimize the exposure time.

Figure 15:
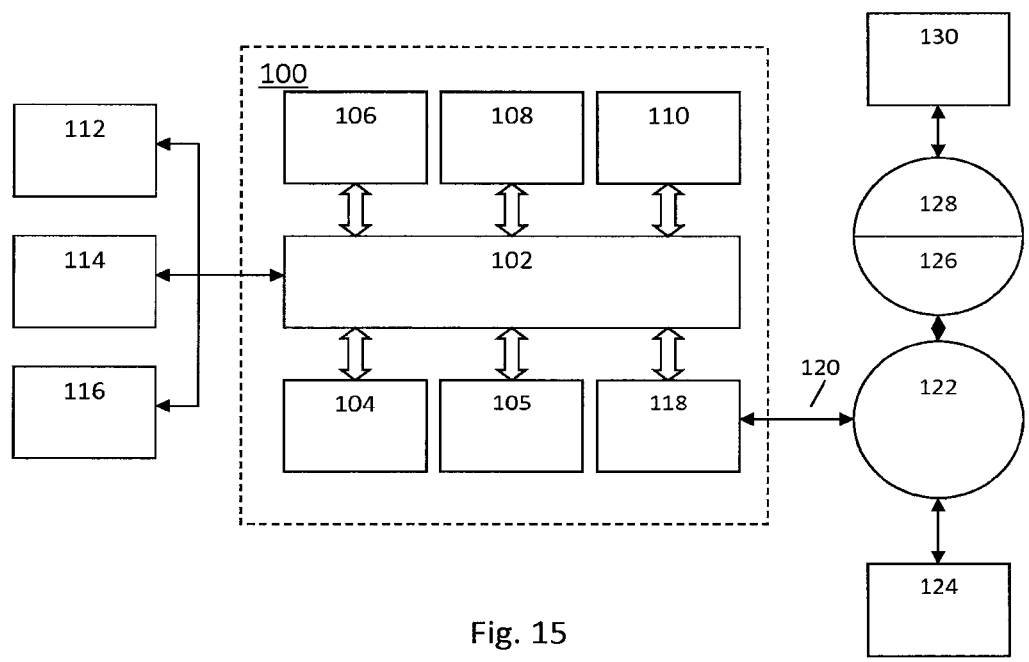
FIG. 15 is a block diagram of an example computer system.

FIG. 15 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 16:
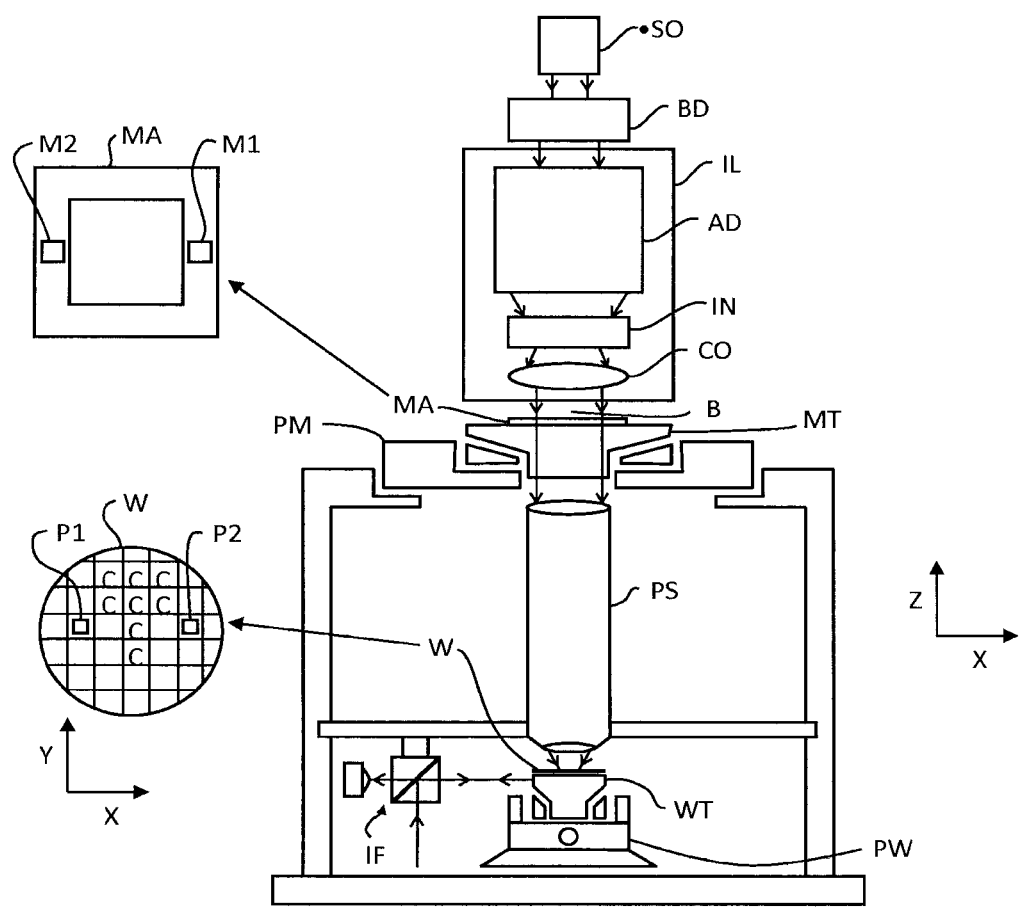
FIG. 16 is a schematic diagram of a lithographic projection apparatus.

FIG. 16 schematically depicts an exemplary lithographic projection apparatus whose illumination source could be optimized utilizing the methods described herein. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 16. However, in the case of a wafer stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 17:
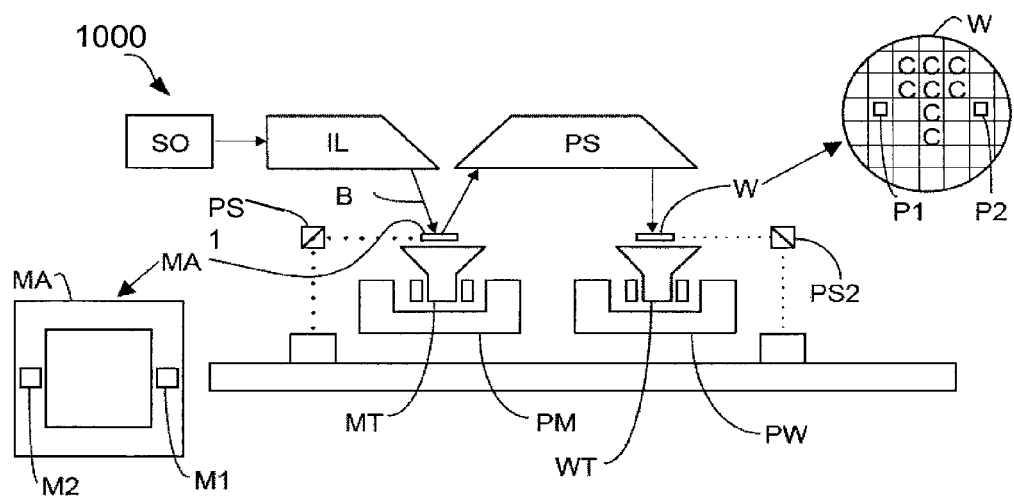
FIG. 17 is a schematic diagram of another lithographic projection apparatus.

FIG. 17 schematically depicts another exemplary lithographic projection apparatus 1000 whose illumination source could be optimized utilizing the methods described herein.

The lithographic projection apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 17, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 17, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 18:
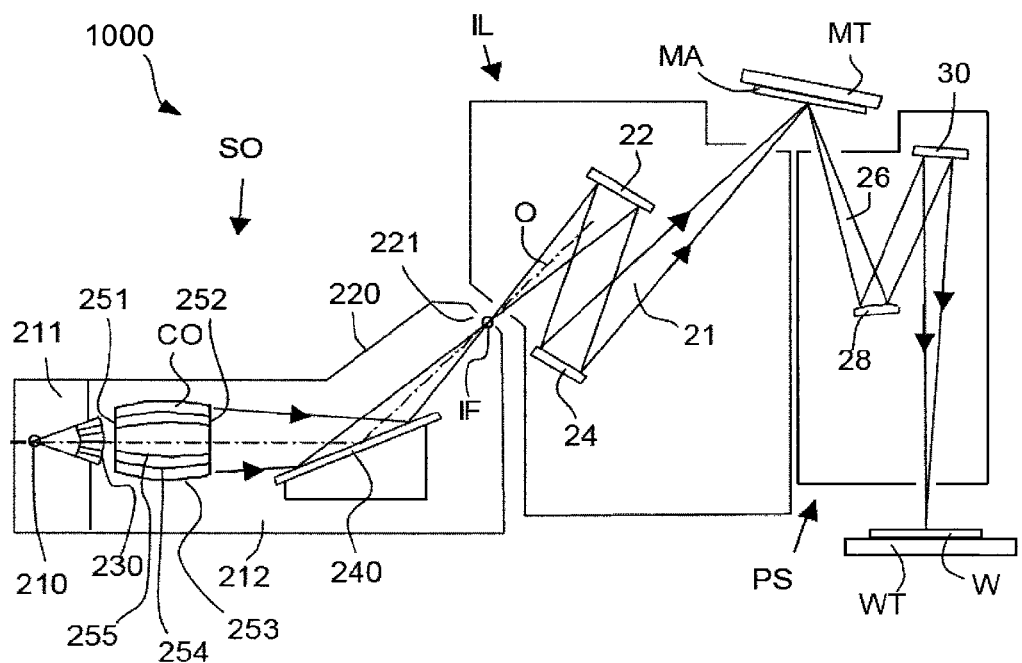
FIG. 18 is a more detailed view of the apparatus in FIG. 17.

FIG. 18 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 18.

Collector optic CO, as illustrated in FIG. 18, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 19:
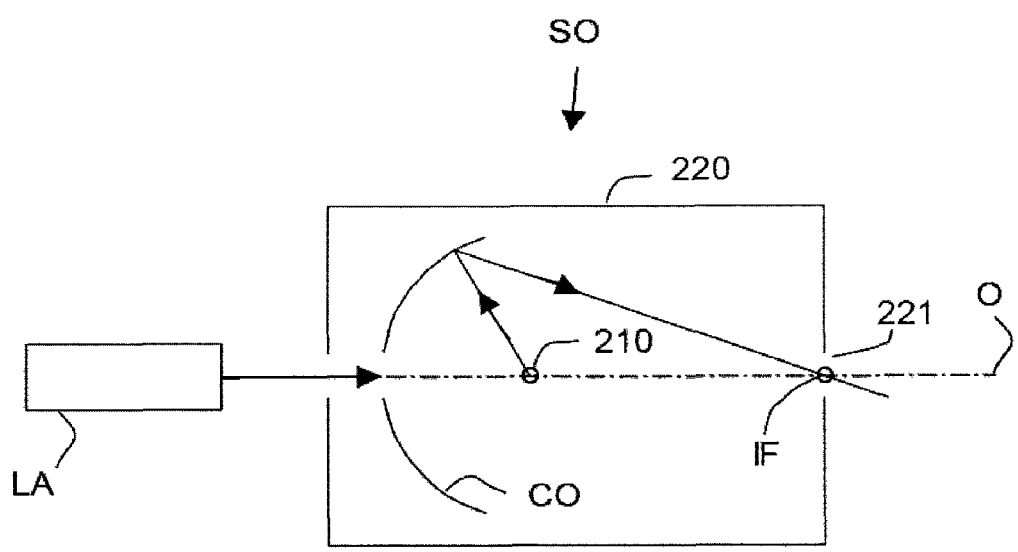
FIG. 19 is a more detailed view of the source collector module SO of the apparatus of FIG. 17 and FIG. 18.

Alternatively, the source collector module SO may be part of an LPP radiation system as shown in FIG. 19. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method comprising:
obtaining at least a characteristic of deformation of a resist layer in a first direction, as if there were no deformation in any directions perpendicular to the first direction;
obtaining at least a characteristic of deformation of the resist layer in a second direction as if there were no deformation in the first direction, the second direction being different from the first direction;
obtaining at least a characteristic of three-dimensional deformation of the resist layer based on the characteristic of the deformation in the first direction and the characteristic of the deformation in the second direction.
2. The method of clause 1, wherein the second direction is perpendicular to the first direction.
3. The method of any one of clauses 1 to 2, further comprising obtaining at least a characteristic of deformation in a third direction as if there were no deformation in the first direction.
4. The method of clause 3, wherein obtaining at least a characteristic of three-dimensional deformation is additionally based on the characteristic of deformation in the third direction.
5. The method of any one of clauses 3 to 4, wherein the first, second and third directions are mutually perpendicular.
6. The method of any one of clauses 1 to 5, wherein the characteristic of three-dimensional deformation is a change in an edge displacement error.
7. The method of any one of clauses 1 to 6, wherein the characteristic of deformation in the first direction is a displacement of a location in the resist layer in the first direction.
8. The method of any one of clauses 1 to 7, wherein the characteristic of deformation in the second direction is a displacement of a location in the resist layer in the second direction.
9. The method of any one of clauses 1 to 8, wherein the resist layer is on a substrate.
10. The method of clause 9, wherein the first direction is perpendicular to the substrate.
11. The method of clause 9, wherein the second direction is parallel to the substrate.
12. The method of clause 9, wherein the substrate constraints at least one of the characteristics of deformations in the first direction and in the second direction.
13. The method of clause 9, wherein a portion of the resist layer in direct contact with the substrate has zero displacement in the first direction.
14. The method of clause 9, wherein a portion of the resist layer in direct contact with the substrate has zero displacement in the second direction.
15. The method of any one of clauses 1 to 14, wherein obtaining at least a characteristic of deformation of the resist layer in the first direction comprises integrating engineering strain over a distance in the first direction.
16. The method of any one of clauses 1 to 15, wherein obtaining at least a characteristic of deformation of the resist layer in the second direction comprises balancing sheer stress and normal stress in the second direction.
17. The method of any one of clauses 1 to 16, wherein the resist layer is developed with a positive tone developer.
18. The method of any one of clauses 1 to 16, wherein the resist layer is developed with a negative tone developer.
19. The method of any one of clauses 1 to 18, wherein portions of the resist layer that are dissolved in development have a Young's modulus of zero.
20. The method of any one of clauses 1 to 19, further comprising adjusting a parameter of a device manufacturing process or a device manufacturing apparatus based on the characteristic of three-dimensional deformation.
21. The method of clause 20, wherein the resist layer will undergo one or more physical or chemical treatments during the device manufacturing process or using the device manufacturing apparatus.
22. The method of any one of clauses 20 to 21, wherein the device manufacturing process is selected from a group consisting of lithography, etching, deposition, doping, metrology, and a combination thereof.
23. The method of any one of clauses 20 to 21, wherein the device manufacturing apparatus is selected from a group consisting of a stepper, an etcher, a spinner, an oven, an optical metrology tool, an electron microscope, an ion implanter, a deposition chamber, and a combination thereof.
24. The method of any one of clauses 20 to 21, wherein the parameter is a parameter of a design layout.

25. The method of clause 24, further comprising manufacturing a mask after adjusting the parameter.
26. The method of any one of clauses 1 to 19, further comprising determining an overlapping process window (OPW) of a plurality of patterns of a design layout, based on the characteristic of three-dimensional deformation.
27. The method of clause 26, further comprising determining or predicting, existence, probability of existence, one or more characteristics, or a combination thereof, of a defect produced from the plurality of patterns, based on the OPW.
28. A computer-implemented method for improving a lithographic process for imaging a portion of a design layout onto a substrate using a lithographic projection apparatus, the method comprising:

computing a multi-variable cost function, the multi-variable cost function being a function of at least a characteristic of deformation of a resist layer on the substrate and a plurality of design variables that are characteristics of the lithographic process;

reconfiguring one or more of the characteristics of the lithographic process by adjusting one or more of the design variables until a certain termination condition is satisfied.
29. The method of clause 28, wherein the characteristic of deformation is a function of at least some of the design variables.
30. The method of any one of clauses 28 to 29, wherein the cost function is a function of an edge placement error.
31. The method of any one of clauses 28 to 30, wherein the one or more of the characteristics comprise at least one parameter of the design layout.
32. The method of clause 31, further comprising manufacturing a mask after reconfiguring the parameter of the design layout.
33. The method of any one of clauses 28 to 32, wherein the characteristic of deformation of the resist layer is a strain at a location in the resist layer.
34. The method of any one of clauses 28 to 32, wherein the characteristic of deformation of the resist layer is displacement of a location in the resist layer.
35. The method of any one of clauses 28 to 32, wherein computing the multi-variable cost function comprises:
obtaining at least a first characteristic of deformation of a resist layer in a first direction, as if there were no deformation in any directions perpendicular to the first direction;
obtaining at least a second characteristic of deformation of the resist layer in a second direction as if there were no deformation in the first direction, the second direction being different from the first direction;
obtaining the characteristic of deformation based on the first characteristic and the second characteristic.
36. The method of clause 35, wherein computing the multi-variable cost function further comprises determining an overlapping process window (OPW) of a plurality of patterns of the design layout, based on the characteristic of three-dimensional deformation.
37. The method of clause 36, further comprising determining or predicting, existence, probability of existence, one or more characteristics, or a combination thereof, of a defect produced from the plurality of patterns, based on the OPW.
38. A non-transitory computer-readable medium having values of a stochastic variation or a variable that is a function of the stochastic variation or that affects the stochastic variation, at a plurality of conditions and at a plurality of values of design variables.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
obtaining at least a characteristic of deformation of a resist layer occurring in a first direction, as if there were no deformation occurring in any directions perpendicular to the first direction;
obtaining at least a characteristic of deformation of the resist layer occurring in a second direction as if there were no deformation occurring in the first direction, the second direction being different from the first direction; and
obtaining, by a hardware computer system, at least a characteristic of three-dimensional deformation of the resist layer based on the characteristic of the deformation occurring in the first direction and the characteristic of the deformation occurring in the second direction.
2. The method of claim 1, further comprising obtaining at least a characteristic of deformation occurring in a third direction as if there were no deformation occurring in the first direction.
3. The method of claim 1, wherein the characteristic of three-dimensional deformation is a change in an edge displacement error.
4. The method of claim 1, wherein the characteristic of deformation occurring in the first direction is a displacement in the first direction of a location in the resist layer, and/or wherein the characteristic of deformation occurring in the second direction is a displacement in the second direction of a location in the resist layer.
5. The method of claim 1, wherein the resist layer is on a substrate and a portion of the resist layer in direct contact with the substrate has zero displacement in the first direction, or wherein the portion of the resist layer in direct contact with the substrate has zero displacement in the second direction.
6. The method of claim 1, wherein obtaining at least a characteristic of deformation of the resist layer occurring in the first direction comprises integrating engineering strain over a distance in the first direction.
7. The method of claim 1, wherein obtaining at least a characteristic of deformation of the resist layer occurring in the second direction comprises balancing sheer stress and normal stress in the second direction.
8. The method of claim 1, wherein the resist layer is developed with a negative tone developer.
9. The method of claim 1, wherein portions of the resist layer that are dissolved in development have a Young's modulus of zero.
10. The method of claim 1, further comprising adjusting a parameter of a device manufacturing process or a device manufacturing apparatus based on the characteristic of three-dimensional deformation.
11. The method of claim 10, wherein the resist layer will undergo one or more physical or chemical treatments during the device manufacturing process or using the device manufacturing apparatus.
12. The method of claim 1, further comprising determining an overlapping process window (OPW) of a plurality of patterns of a design layout, based on the characteristic of three-dimensional deformation.

13. The method of claim 12, further comprising determining or predicting, an existence, a probability of existence, one or more characteristics, or a combination selected therefrom, of a defect produced from the plurality of patterns, based on the OPW.

14. A method for improving a lithographic process for creating-a portion of a design layout on a substrate using a lithographic apparatus, the method comprising:
  computing, by a hardware computer system, a multi-variable cost function, the multi-variable cost function being a function of at least a characteristic of deformation of a resist layer on the substrate and a plurality of design variables that are characteristics of the lithographic process; and
  reconfiguring one or more of the characteristics of the lithographic process by adjusting one or more of the design variables and re-computing the multi-variable cost function until a certain termination condition is satisfied.

15. The method of claim 14, wherein the characteristic of deformation of the resist layer is a strain at a location in the resist layer, and/or wherein the characteristic of deformation of the resist layer is displacement of a location in the resist layer.

16. The method of claim 14, wherein the characteristic of deformation is a function of one or more of the design variables.

17. The method of claim 14, wherein the one or more of the characteristics of the lithographic process comprise a parameter of the design layout.

18. A non-transitory computer readable-medium comprising instructions configured to cause a computer system to:
  obtain at least a characteristic of deformation of a resist layer occurring in a first direction, as if there were no deformation occurring in any directions perpendicular to the first direction;
  obtain at least a characteristic of deformation of the resist layer occurring in a second direction as if there were no deformation occurring in the first direction, the second direction being different from the first direction; and
  obtain at least a characteristic of three-dimensional deformation of the resist layer based on the characteristic of the deformation occurring in the first direction and the characteristic of the deformation occurring in the second direction.

19. The computer-readable medium of claim 18, wherein the instructions are further configured to cause the computer system to:
  compute a multi-variable cost function, the multi-variable cost function being a function of at least the characteristic of three-dimensional deformation and a plurality of design variables that are characteristics of a lithographic process for creating a portion of a design layout on a substrate using a lithographic apparatus; and
  reconfigure one or more of the characteristics of the lithographic process by adjusting one or more of the design variables and re-computing the multi-variable cost function until a certain termination condition is satisfied.

20. The computer-readable medium of claim 18, wherein the instructions are further configured to cause the computer system to obtain at least a characteristic of deformation occurring in a third direction as if there were no deformation occurring in the first direction.

* * * * *